United States Patent [19]

Celestino et al.

[11] Patent Number: 4,579,618
[45] Date of Patent: Apr. 1, 1986

[54] PLASMA REACTOR APPARATUS

[75] Inventors: Salvatore A. Celestino, Novato; Georges J. Gorin, Pinole; Stephen E. Hilliker; Gary B. Powell, both of Petaluma, all of Calif.

[73] Assignee: Tegal Corporation, Novato, Calif.

[21] Appl. No.: 665,098

[22] Filed: Oct. 29, 1984

Related U.S. Application Data

[63] Continuation of Ser. No. 568,859, Jan. 6, 1984, abandoned.

[51] Int. Cl.⁴ .............. B44C 1/22; C03C 15/00; C03C 25/06; C23F 1/02
[52] U.S. Cl. .................. 156/345; 156/643; 156/646; 204/298; 204/192 E
[58] Field of Search .............. 156/345, 643, 646; 204/164, 192 EC, 192 E, 298; 118/728, 50.1, 620; 427/38, 39; 134/1

[56] References Cited

U.S. PATENT DOCUMENTS 4,298,419 11/1981 Suzuki et al. .................. 204/298 X
4,316,791 2/1982 Taillet ........................ 156/345 X
4,352,725 10/1982 Tsukada ...................... 156/345 X
4,411,733 10/1983 Macklin et al. ................ 156/345 X
4,464,223 8/1984 Gorin ......................... 156/643

FOREIGN PATENT DOCUMENTS 0033839 4/1981 Japan ......................... 156/643
0186937 11/1983 Japan .

Primary Examiner—William A. Powell
Attorney, Agent, or Firm—Paul F. Wille

[57] ABSTRACT

Plasma processing is accomplished with an improved single electrode reactor apparatus. High and low frequency power supplies are coupled to the single electrode to provide increased process flexibility, control and residue removal. A multi-stage passive filter network is disclosed which performs the functions of coupling both power supplies to the electrode, isolating the low frequency power supply from the high frequency power supply and attenuating the undesired frequencies produced by mixing of the two frequencies in the nonlinear load represented by the reactor.

3 Claims, 2 Drawing Figures

4,579,618

PLASMA REACTOR APPARATUS

This application is a continuation of application Ser. No. 568,859, filed Jan. 6, 1984, abandoned.

FIELD OF THE INVENTION

The present invention relates, in general, to plasma reactors and their use. More particularly, the invention relates to a single electrode, multi-frequency plasma reactor.

BACKGROUND OF THE INVENTION

Various forms of processing with ionized gases, such as plasma etching and reactive ion etching, are increasing in importance particularly in the area of semiconductor device manufacturing. Thus, the investigation of the effects of the variation of various process parameters defining a plasma process has been pursued. Of particular interest are the various etching processes used in semiconductor device manufacturing. It is increasingly necessary to produce very fine lines with such processes, which requires a high degree of process uniformity, flexibility and control. A further need exists for apparatus which provides efficient wafer handling.

As disclosed in U.S. Pat. No. 4,464,223, it has been discovered that a plasma reactor which is capable of applying power of more than one frequency to energize the plasma offers significant advantages in terms of process flexibility, control, and uniformity. However, the advantages of such a dual frequency process have only been achievable in multi-electrode plasma reactors. Such reactors are structurally more complex and therefore may be commercially disadvantageous in some circumstances.

A particular need exists in the area of metal etching processes. In order to achieve the desired end result, it is necessary to adequately remove any organic and/or inorganic residues from the etched surface. Prior art etching processes have proved lacking in one respect or another in providing an adequately clean surface following a metal etching step.

SUMMARY OF THE INVENTION

Accordingly, it is an object of the present invention to provide an improved plasma reactor apparatus and method.

A further object of the present invention is to provide a plasma reactor apparatus and method by which a single electrode may be used to apply power of more than one frequency to the reaction volume.

Yet a further object of the present invention is to provide an improved method and apparatus for metal etching whereby surface residues, both organic and inorganic, are effectively removed.

A particular embodiment of the present invention comprises a plasma reactor apparatus having an enclosure and an electrode. The electrode is adapted to carry the workpiece and also mates to the lower portion of the enclosure to seal the reaction volume. In addition, the electrode is electrically insulated from the enclosure. A manifold is provided within the enclosure to distribute the input reactive gases and to allow reaction products to be exhausted by means of a vent connected to a vacuum pump. Typically, temperature control means such as water jackets are provided in the enclosure and the electrode. Also, an optical window is provided for purposes of process monitoring.

A power supply apparatus, which is coupled to the single electrode by an RF transmission line, comprises a low frequency power supply and a high frequency power supply. Typically, the low frequency power supply operates at approximately 100 KHz and the high frequency power supply operates at approximately 13.56 MHz. Both power supplies are coupled to the electrode through coupling networks which serve to optimize RF transmission through impedance matching. It is necessary to efficiently couple both the high and low frequency power supplies to the electrode while providing isolation between the power supplies. Furthermore, the problem of coupling RF power to a non-linear load such as a plasma reactor is very complex. This is especially true in the case of commercial units which must meet stringent FCC limits on emitted radiation. To meet these needs, a specialized filter/combiner is provided which couples both power supplies to the electrode and provides isolation while suppressing mixing products of the two frequencies caused by the non-linear nature of the load.

A particular embodiment of the invention comprises a method of metal etching utilizing the previously described apparatus which has proved particularly useful for aluminum etching. For instance, it has been found that a reactive atmosphere comprising carbon tetrachloride, chlorine, and argon which is subjectd simultaneously to 250 watts at 13.56 MHz and 20 watts at 100 KHz provides excellent etching of an aluminum/silicon/1% copper layer. The surface remaining after such an etching process is substantially cleaner than that left by prior art processes.

These and other objects and advantages of the present invention will be apparent to one skilled in the art from the detailed description below taken together with the drawings.

DETAILED DESCRIPTION TO THE INVENTION

Figure 1:
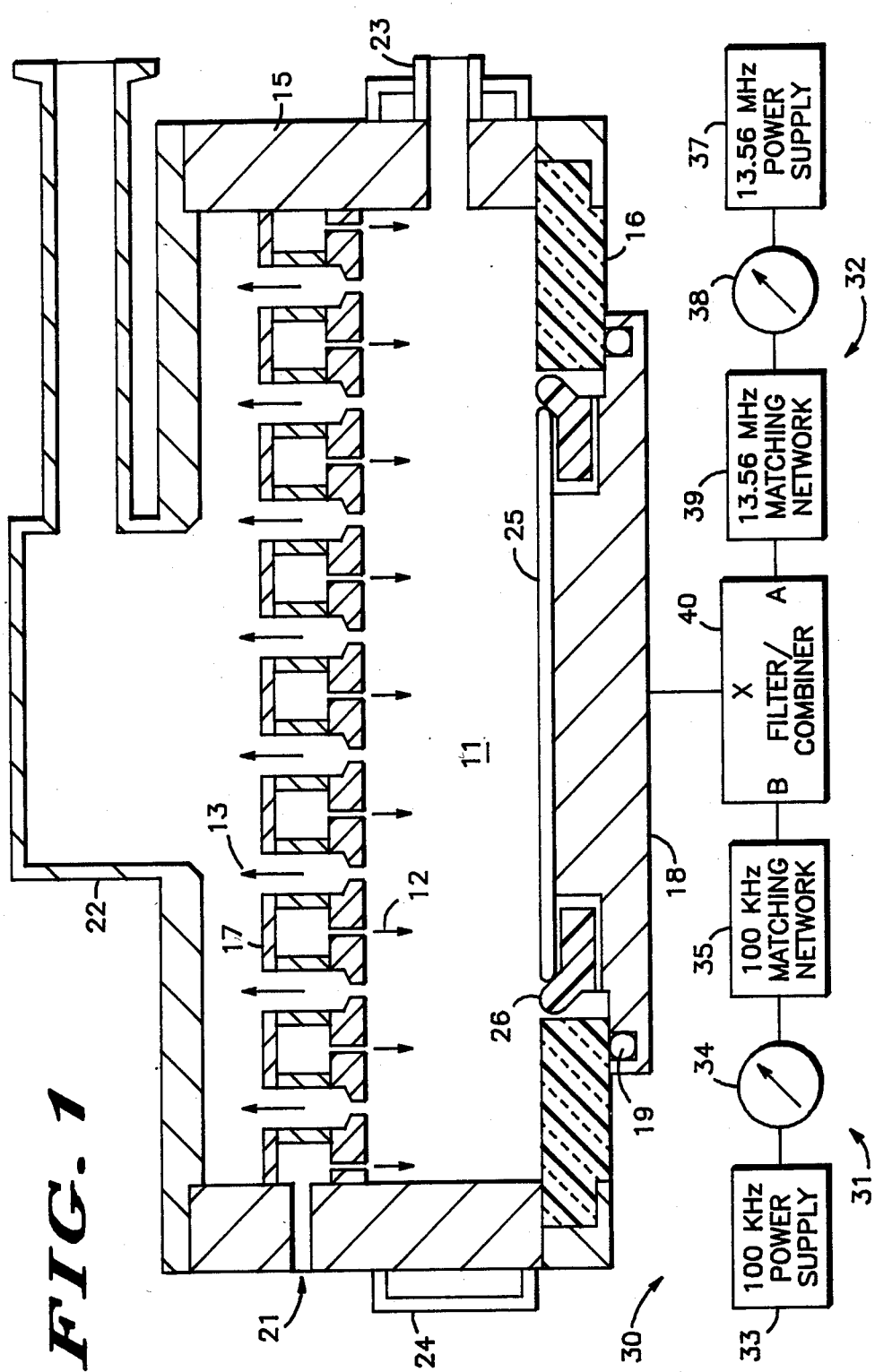
FIG. 1 is a schematic cross-sectional view of an apparatus according to a particular embodiment of the present invention.

Referring to FIG. 1, a plasma reactor apparatus according to the principles of the present invention is illustrated in cross-section. Plasma reactor 10 is designed, in broad terms, to enclose a reaction volume 11, supply a reactive gas mixture 12 thereto, exhaust reaction products 13 therefrom, and impose an RF electric field therein. An enclosure 15 which includes a ceramic insulator lower portion 16, a manifold 17 and an electrode 18 serve to define reaction volume 11. Enclosure 15 is conductive and electrically grounded. Electrode 18 is adapted to sealably engage ceramic insulator 16 and is supplied wlth an O-ring seal 19 to accomplish an adequate seal therebetween. Manifold 17 is coupled to a supply means 21 and is adapted to supply reactive gas 12 to reaction volume 11. In addition, manifold 17 directs reaction products 13 comprising used and unused reactive gas and chemical products of the reaction to a vent 22 so that they may be exhausted by a vacuum pump which is not shown. Manifold 17 may be of the type disclosed in U.S. Pat. No. 4,209,357 issued June 24, 1980 and assigned to the assignee of the present invention.

Plasma reactor apparatus 10 also includes an optical window 23 in enclosure 15 whereby the optical properties of the plasma in reaction volume 11 may be monitored. In addition, a temperature control device such as water jacket 24 is provided. As is well-known in the art, it is also common to provide temperature control devices such as water jackets and/or heating devices in electrode 18.

Electrode 18 serves the dual purpose of energizing reactive gas 12 and providing the means by which workpieces are loaded and unloaded from reaction volume 11. During the loading process electrode 18 is lowered away from ceramic insulator 16, whereby access to reaction volume 11 is provided. In addition, electrode 18 is adapted to serve as a workpiece holder. A semiconductor wafer 25, which is surrounded and carried by a wafer ring 26, is supported by electrode 18. This single electrode arrangement is particularly advantageous in that it readily interfaces with an automated wafer transport system.

A power supply apparatus 30 is coupled to electrode 18 to supply RF power thereto. According to the present invention, power supply apparatus 30 comprises a low frequency portion 31 and a high frequency portion 32. In the nomenclature associated with plasma reactors and plasma processes it is common to describe as "high frequency" any frequency greater than about 10 MHz. Similarly, "low frequency" is used to describe any frequency less than approximately 1 MHz. The use of combined high and low frequencies in plasma processes has been described in U.S. Pat. No. 4,464,223. However, that disclosure describes the use of multiple frequencies in a multiple electrode reactor apparatus. It has not been known heretofore that multiple frequencies could be successfully combined in a single electrode apparatus.

In the particular case of this embodiment of the present invention, low frequency portion 31 of power supply 30 comprises a 100 KHz power supply 33, a power meter 34 and a 100 KHz matching network 35. Power meter 34 serves to monitor the power level of the 100 KHz power being supplied to reaction volume 11. Matching network 35 serves to optimize the transmission of 100 KHz power to electrode 18 by means of impedance matching. Matching network 35 may comprise, for instance, an impedance transformer. Similarly, high frequency portion 32 of power supply 30 comprises a 13.56 MHz power supply 37, a power meter 38 and a 13.56 MHz matching network 39. Matching network 39 may comprise, for instance, an automated slug-tuning apparatus.

A filter/combiner 40 is coupled between low frequency power supply 31, high frequency power supply 32 and electrode 18. Ports A and B of filter/combiner 40 are coupled to high frequency power supply 31 and low frequency power supply 32, respectively. Port X of filter/combiner 40 is coupled to electrode 18. Filter/combiner 40 must serve three purposes which are unique to a single electrode, dual frequency plasma reactor. First, the high frequency power must be largely prevented from reaching the low frequency power supply to prevent damage. The converse of this isolation problem is provided by 13.56 MHz matching network 39. Second, the mixing products caused by the coupling of two different frequencies to a non-linear load (the plasma reactor) must be attenuated in order to comply with FCC regulations. Third, the radiation emitted by the reactor and the various interconnections must be minimized.

Figure 2:
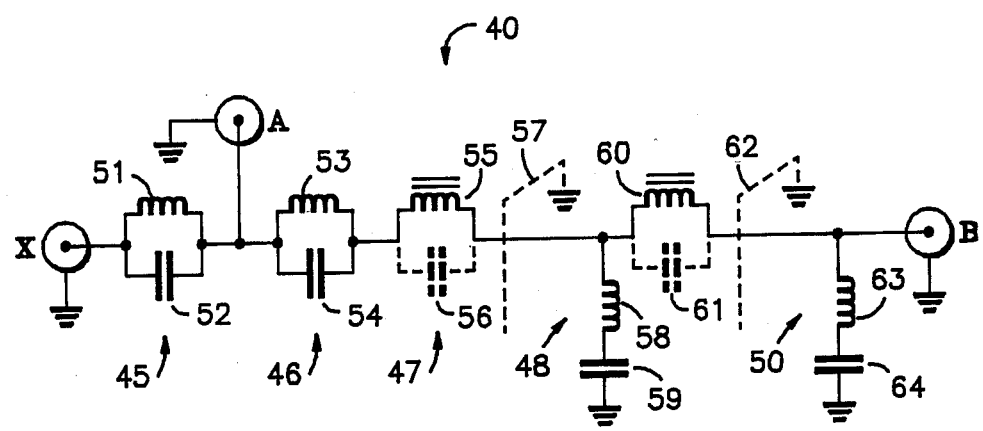
FIG. 2 is a schematic diagram of a filter/combiner according to a particular embodiment of the present invention.

Referring now to FIG. 2, filter/combiner 40 is shown schematically. Ports A, B and X are shown schematically as coaxial connectors, since the interconnection of the various elements is generally accomplished with coaxial cable. Each of the indicated ground connections in filter/combiner 40 is coupled to the same ground as is enclosure 15 (FIG. 1). This minimizes ground currents. In broad terms, filter/combiner 40 comprises first through sixth stages 45, 46, 47, 48, 49 and 50, respectively, coupled between port X and port B. Port A is coupled out between first stage 45 and second stage 46.

First stage 45 of filter/combiner 40 is a parallel tank circuit made up of inductor 51 and capacitor 52. In a particular embodiment, first stage 45 is intended to attenuate the 40.68 MHz mixing product. Inductor 51 has a value of 0.153 $\mu$h and capacitor 52 has a value of 100 pf.

Second stage 46 is also a tank circuit which comprises an inductor 53 and a capacitor 54. In the particular embodiment, second stage 46 is intended to attenuate the 13.56 MHz signal between ports A and B. This provides the required isolation and prevents stages three through six from altering the 13.56 MHz matching. Inductor 53 has a value of 1.38 $\mu$h and capacitor 54 has a value of 100 pf.

Third stage 47, which is connected in series with first stage 45 and second stage 46, comprises a cored inductor 55 and its parallel parasitic capacitance 56. In the particular embodiment, third stage 47 serves to attenuate the 27.12 MHz mixing product between ports X and B. Inductor 55 has a value of 10 $\mu$h and parasitic capacitance 56 has a value of 3.4 pf.

Fourth stage 48 is coupled between the line between ports X and B and ground. In addition, electro-magnetic coupling between third stage 47 and fourth stage 48 is prevented by grounded shield 57. Fourth stage 48 combines with first stage 45 and firth stage 49 to attenuate the 40.68 MHz mixing product between ports X and B. Fourth stage 48 comprises an inductor 58 and a series-connected capacitor 59. Inductor 58 has a value of 0.2 $\mu$h and capacitor 59 has a value of 75 pf.

Fifth stage 49, another parallel tank circuit series-connected between ports X and B, comprises a cored inductor 60 and its parallel parasitic capacitance 61. Like fourth stage 48, it is resonant at 40.68 MHz in the particular embodiment. Inductor 60 has a value of 5 $\mu$h and parasitic capacitance 61 has a value of 3 pf.

A second grounded shield 62 separates fifth stage 49 from sixth stage 50. Sixth stage 50, which serves to attenuate the 67.8 MHz mixing product between ports X and B, comprises an inductor 63 and a series-connected, grounded capacitor 64. Inductor 63 has a value of 0.07 $\mu$h and capacitor 64 has a value of 75 pf.

Filter/combiner 40 is typically augmented by ensuring good RF contact between the various panels which make up the cabinet of the plasma reactor apparatus to contain any radiation which might exist. Filter/combiner 40 represents a delicate compromise between being able to provide good impedance matching and providing the necessary attenuation of harmonics.

As is disclosed in U.S. Pat. No. 4,464,223, the combination of high and low frequencies in plasma processes has been found to offer increased flexibility and control. Generally, this is due to the fact that the degree of dissociation and the ion energy cross-section in the plasma are strong functions of frequency, as is the ion energy. In other words, different percent dissociations and ion energy cross-sections are produced at the high and low frequencies with higher ion energies being present in the low frequency discharge. Therefore, by controlling the relative power levels of the two power supplies in the disclosed apparatus a process which combines a high etch rate with excellent residue removal is achievable.

In particular, the dual frequency, single electrode reactor apparatus disclosed herein is well-suited to metal etching processes. By way of example, a process for etching aluminum/silicon with an admixture of 1% copper is described. In this process, the 13.56 MHz power supply is operated at 250 watts and the 100 KHz power supply is operated at 20 watts. The reactive gas comprises 50 standard cubic centimeters per minute (sccm) of carbon tetrachloride, 15 sccm of chlorine and 40 sccm of argon. The system operating pressure is maintained at 270 mtorr. The etch rate of this process is roughly 7000 to 8000 Å/min. It has been found that the described process provides excellent etching characteristics and further provides a surface which is substantially clear of organic and inorganic contaminants. Prior art metal etching processes generally leave substantial residues which may affect subsequent processing steps and the long term reliability of the finished device.

The plasma reactor apparatus and method described above provide an improvement in plasma processes. The present invention combines the advantages of a dual frequency plasma process with the simplicity and commercial advantage of a single electrode reactor. In addition, the disclosed method for etching metals provides a substantially cleaner surface than did prior art methods.

While the present invention has been disclosed with reference to a particular embodiment thereof, various modifications and changes will be apparent to those skilled in the art and may be made without departing from the spirit and scope of the invention.

We claim:

1. In a plasma reactor apparatus having a reaction volume for containing a reactive gas and electrode means for producing as electric field within said volume, the improvement comprising:
    means for supplying electrical power to said electrode means at a low frequency;
    means for supplying electrical power to said electrode means at a high frequency; and
    a filter/combiner interconnecting said low frequency power supply, said high frequency power supply, and said electrode means; said filter/combiner being adapted to couple said low and high frequency power supplies to said electrode means, isolate said low frequency power supply from said high frequency power supply and attenuate undesired mixing products of said high and low frequencies.

2. The apparatus as set forth in claim 1 wherein an enclosure means partially defines said reaction volume and wherein said enclosure means is grounded.

3. The apparatus as set forth in claim 1 wherein said filter/combiner comprises a multi-stage passive filter network having at least one stage for attenuating high frequency electrical power between said high frequency power supply and said low frequency power supply and at least one stage for attenuating undesired mixing products.

* * * * *